United States Patent
Gupta

(10) Patent No.: US 7,466,746 B2
(45) Date of Patent: Dec. 16, 2008

(54) SINGLE AMPLIFIER PRESALE PROCESSING CIRCUITRY

(75) Inventor: Sandeep Kumar Gupta, Santa Clara, CA (US)

(73) Assignee: Teranetics, Inc., Santa Clara, CA (US)

( * ) Notice: Subject to any disclaimer, the term of this patent is extended or adjusted under 35 U.S.C. 154(b) by 723 days.

(21) Appl. No.: 11/148,988

(22) Filed: Jun. 9, 2005

(65) Prior Publication Data

US 2006/0280234 A1    Dec. 14, 2006

(51) Int. Cl.
  *H04B 1/38* (2006.01)
(52) U.S. Cl. .................. 375/219; 370/286; 379/406.01
(58) Field of Classification Search ................. 375/219, 375/222; 370/286; 379/406.01
  See application file for complete search history.

(56) References Cited

U.S. PATENT DOCUMENTS

| | | | |
|---|---|---|---|
| 4,608,464 A * | 8/1986 | Morikawa et al. ...... | 379/406.06 |
| 6,067,316 A | 5/2000 | Amrany et al. | |
| 6,265,998 B1 | 7/2001 | Bann et al. | |
| 6,643,271 B1 | 11/2003 | Henri | |
| 6,771,770 B2 | 8/2004 | Casier et al. | |
| 6,804,349 B1 | 10/2004 | Prat et al. | |
| 6,882,218 B2 | 4/2005 | Gupta | |
| 6,895,040 B2 | 5/2005 | Zhou | |
| 6,904,146 B2 | 6/2005 | Domer et al. | |
| 6,947,478 B1 * | 9/2005 | Hauptmann et al. ......... | 375/222 |
| 6,980,644 B1 * | 12/2005 | Sallaway et al. ............ | 379/391 |
| 7,307,965 B2 * | 12/2007 | Huang et al. ................ | 370/286 |

* cited by examiner

*Primary Examiner*—Temesghen Ghebretinsae
(74) *Attorney, Agent, or Firm*—Brian R. Short

(57) ABSTRACT

An device and method for a pre-sampling processing is disclosed. The pre-sampling device includes a single amplifier having a virtual ground node, and a feed back circuit connected from an output of the amplifier to the virtual ground node. The feed back circuit includes a plurality of switches connected to the virtual ground node. The switches control a plurality of programmable gain settings. The feed back circuit also includes an adjustable current source that is adjusted according to an estimated echo signal. A current of the adjustable current source is summed at the virtual ground node. The feed back circuit also includes a low pass filter that is tuned to suppress received signal frequencies above a fraction of a sampling frequency of a sampler connected to the pre-sampling device.

20 Claims, 7 Drawing Sheets

Receiver

SINGLE AMPLIFIER PRESALE PROCESSING CIRCUITRY

FIELD OF THE INVENTION

The invention relates generally to communication systems. More particularly, the invention relates to an apparatus and method for single amplifier pre-sampling signal processing.

BACKGROUND OF THE INVENTION

High-speed networks are continually evolving. The evolution includes a continuing advancement in the operational speed of the networks. The network implementation of choice that has emerged is Ethernet networks physically connected over unshielded twisted pair wiring. Ethernet in its 10BASE-T form is one of the most prevalent high speed LANs (local area network) for providing connectivity between personal computers, workstations and servers.

High-speed LAN technologies include 100BASE-T (Fast Ethernet) and 1000BASE-T (Gigabit Ethernet). Fast Ethernet technology has provided a smooth evolution from 10 Megabits per second (Mbps) performance of 10BASE-T to the 100 Mbps performance of 100BASE-T. Gigabit Ethernet provides 1 Gigabit per second (Gbps) bandwidth with essentially the simplicity of Ethernet. There is a desire to increase operating performance of Ethernet to even greater data rates.

FIG. 1 shows a block diagram of an Ethernet transceiver pair communicating over a bi-directional transmission channel, according to the prior art. The transceiver pair includes a first transceiver 100 and a second transceiver 105. The first transceiver 100 includes a transmitter section 110 that receives digital data for transmission over a transmission channel 135. The first transceiver 100 also includes a receiver section 120 that receives data.

The transceiver includes a digital to analog converter (DAC) for transmission, and an analog to digital converter (ADC) for reception. The hybrid circuit 130 is designed to reduce the level the transmit signal present in the receive signal path. The transmitter section 110 and the receiver section 120 are connected to a common twisted pair causing some of the transmission signals of the transmitter section 110 to be coupled into the receive signals of the receiver section 120. The coupled signal can be referred to as an "echo" signal. The echo signal can include two separate primary components. The first component includes transmission signals due to the direct connection of the transmitter sections to the input of the receiver sections. The second component includes reflections of the transmit signal within the transmission channel.

The hybrid circuit 140 of the second transceiver 105 operates in the same manner as the hybrid circuit 130 of the first transceiver 100. The transmitter section 150 and the receiver section 160 of the second transceiver 105 operate in the same manner as the transmitter section 110 and receiver section 120 of the first transceiver 100.

An implementation of high speed Ethernet networks includes simultaneous, full bandwidth transmission, in both directions (termed full duplex), within a selected frequency band. When configured to transmit in full duplex mode, Ethernet line cards are generally required to have transmitter and receiver sections of an Ethernet transceiver connected to each other in a parallel configuration to allow both the transmitter and receiver sections to be connected to the same twisted wiring pair for each of four pairs. As a result, each of the four receivers typically suffers from echo signal interference.

The hybrid circuits 130, 140 can include echo signal cancellation of the above-described first component of the echo signal. Additionally, the received signals can be gain adjusted to compensate for variations in attenuation of the signals during transmission due, for example, because of variations in cable lengths. The received signals are sampled within the receiver sections 100, 120. Sampling requires the received signals to be filtered prior to sampling to minimize aliasing. Therefore, the received signals should also be low-pass filtered with an Anti-Aliasing Filter (AAF).

It is desirable to minimize the effects of echo signals. Additionally, it is desirable to provide programmable gain of received signals and filter the signals. It is desirable to provide these features with circuitry that is low cost, low noise and includes high linearity.

SUMMARY OF THE INVENTION

An embodiment of the invention includes a pre-sampling device. The pre-sampling device includes a single amplifier having a virtual ground node, and a feed back circuit connected from an output of the amplifier to the virtual ground node. The feed back circuit includes a plurality of switches connected to the virtual ground node. The switches control a plurality of programmable gain settings. The feed back circuit also includes an adjustable current source that is adjusted according to an estimated echo signal. A current of the adjustable current source is summed at the virtual ground node. The feed back circuit also includes a low pass filter that is tuned to suppress received signal frequencies above a fraction of a sampling frequency of a sampler connected to the pre-sampling device.

Another embodiment includes a method of processing a signal before sampling. The method includes supplying a received signal and echo signal to a preprocessing circuit, the preprocessing circuit comprising an amplifier, summing an echo signal cancellation current to a virtual ground node of the amplifier, setting a programmable gain setting of switches connected to the virtual ground node, the adjustable current source being adjusted according to an estimated echo signal, and anti-alias filtering the received signal as determined by a virtual ground node capacitance and an amplifier output capacitance.

Other aspects and advantages of the present invention will become apparent from the following detailed description, taken in conjunction with the accompanying drawings, illustrating by way of example the principles of the invention.

DETAILED DESCRIPTION

The invention includes an apparatus and method of preprocessing received analog signals before sampling. The preprocessing includes adjustable gain, filtering and echo current cancellation. The echo current cancellation is adjustable, and can be adaptive. The preprocessing can be implemented with a single amplifier, and therefore, is less expensive.

Figure 1:
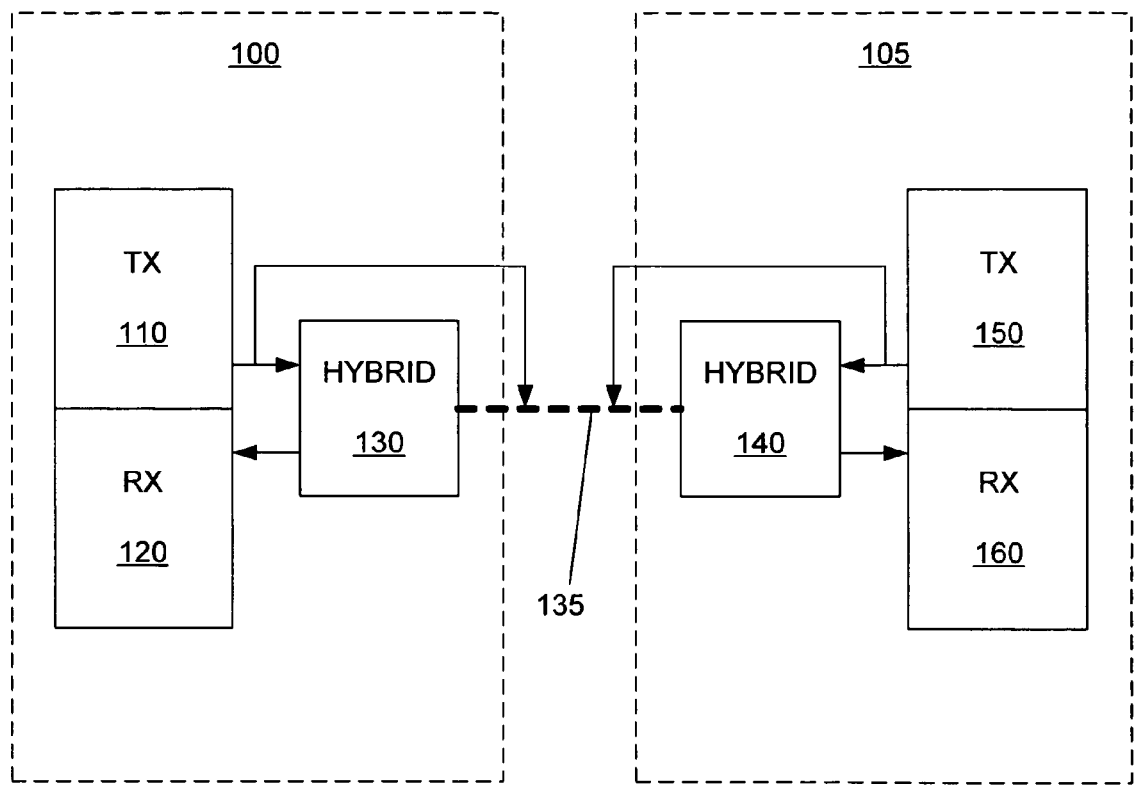
FIG. 1 shows a prior art pair of Ethernet transceivers.
Figure 2:
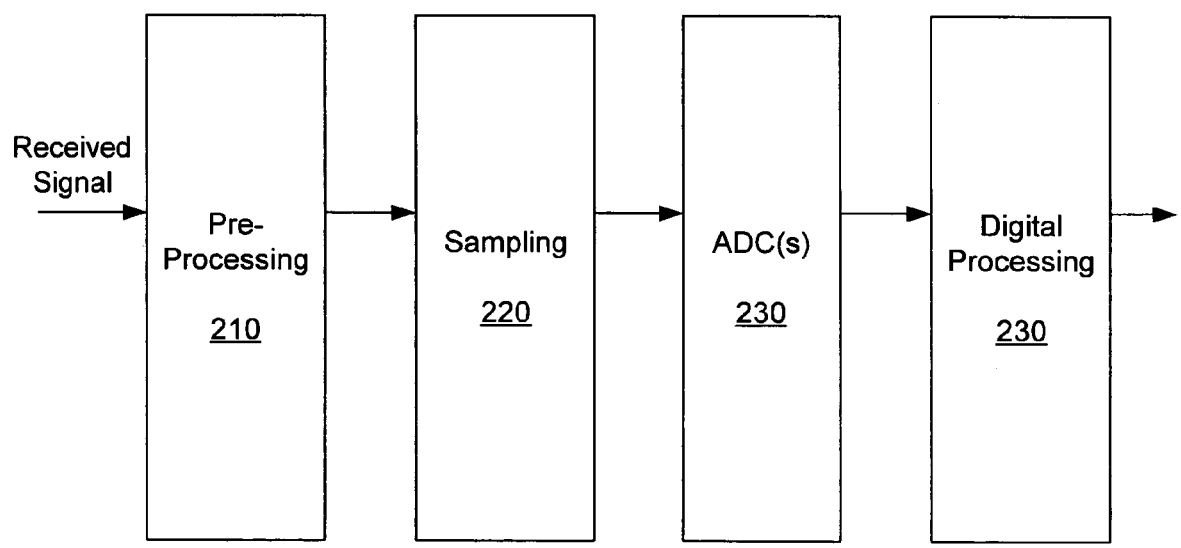
FIG. 2 shows an Ethernet transceiver that includes an exemplary preprocessing circuit.

FIG. 2 shows an Ethernet transceiver that includes an exemplary preprocessing circuit. The preprocessing circuit 210 includes echo signal cancellation, programmable gain adjustments and anti-aliasing filtering. The echo signal cancellation can be adaptive. A sampling circuit 220 receives the preprocessed signal and generates samples. An analog to digital converter (ADC) 230 generates digital samples. The digital samples are digitally processed by digital processing circuitry 230.

As previously described, the received signals include an echo signal which needs to be minimized or cancelled. Additionally, the received signals should be gain adjusted and filtered before sampling by the sampling circuit 220.

Figure 3:
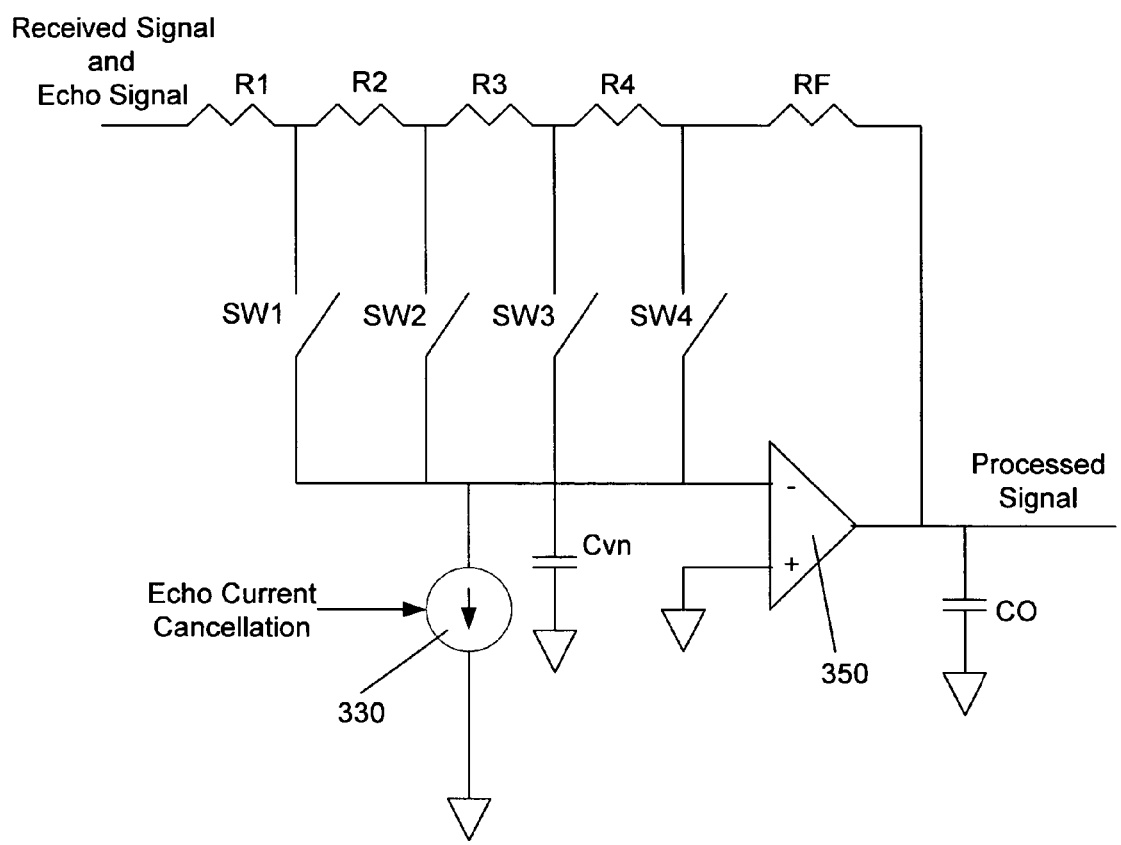
FIG. 3 shows an exemplary preprocessing circuit.

FIG. 3 shows an exemplary preprocessing circuit. A signal input to the preprocessing circuit includes a received signal, and an echo signal. The echo signal, as previously described, is an undesired signal that is coupled into the received signal because the transceiver that includes the preprocessing circuit is transmitting signals simultaneous with the transceiver receiving other signals. The preprocessing circuit minimizes the echo signal. The preprocessing circuit provides a programmable gain of the received signal, and also provides anti-aliasing filtering for subsequent sampling of the received signal. This preprocessing circuit is cost effective because it only includes a single amplifier.

The preprocessing circuit provides a programmable gain by selectively closing switches SW1, SW2, SW3, SW4. As shown, the switches switch in a corresponding set of input resistors R1, R2, R3, R4. The inputs resistors R1, R2, R3, R4 along with the feedback resistor RF set the gain of the preprocessing circuit.

A current source 330 provides a programmable current for canceling the echo signal. The current of the current source 330 negates current at the virtual node induced by the echo signal present at the input of the preprocessing circuit. The result is that the echo current does not flow through the feedback resistor RF, thereby subtracting the echo signal from the output (processed signal). The current source 330 can just as easily sinks current rather than sourcing current as shown.

The programmable current source can be controlled by estimating the echo signal. The estimate can be based upon transmit signals of the transceiver that includes the preprocessing circuit. An exemplary current source 330 includes an echo cancellation DAC (as will be described later) or a replica of a transmit signal (also described later). An input to an echo cancellation DAC can be the replica of a transmit signal, or the input can be from a digital signal processing (DSP) engine that is adaptive, and can account for reflections of transmit signal as well.

An undesirable feature of this embodiment is that the echo cancellation current is conducted through the switches SW1, SW2, SW3, SW4. The echo signal is typically much greater in amplitude than the desired received signal. The large amplitude of the echo signal can cause non-linear distortion within the switches SW1, SW2, SW3, SW4, thereby eroding the effects of echo cancellation.

The received signal is filtered by a two pole filter provided by capacitance Cvn of the virtual ground node of the amplifier 330, and output capacitance CO. Typically, the capacitance values of capacitors Cvn and CO are estimated through computer simulation of the processing circuitry. A roll-off frequency of the two pole low-pass filter can be realized by setting the values of the capacitors Cvn and CO.

Figure 4:
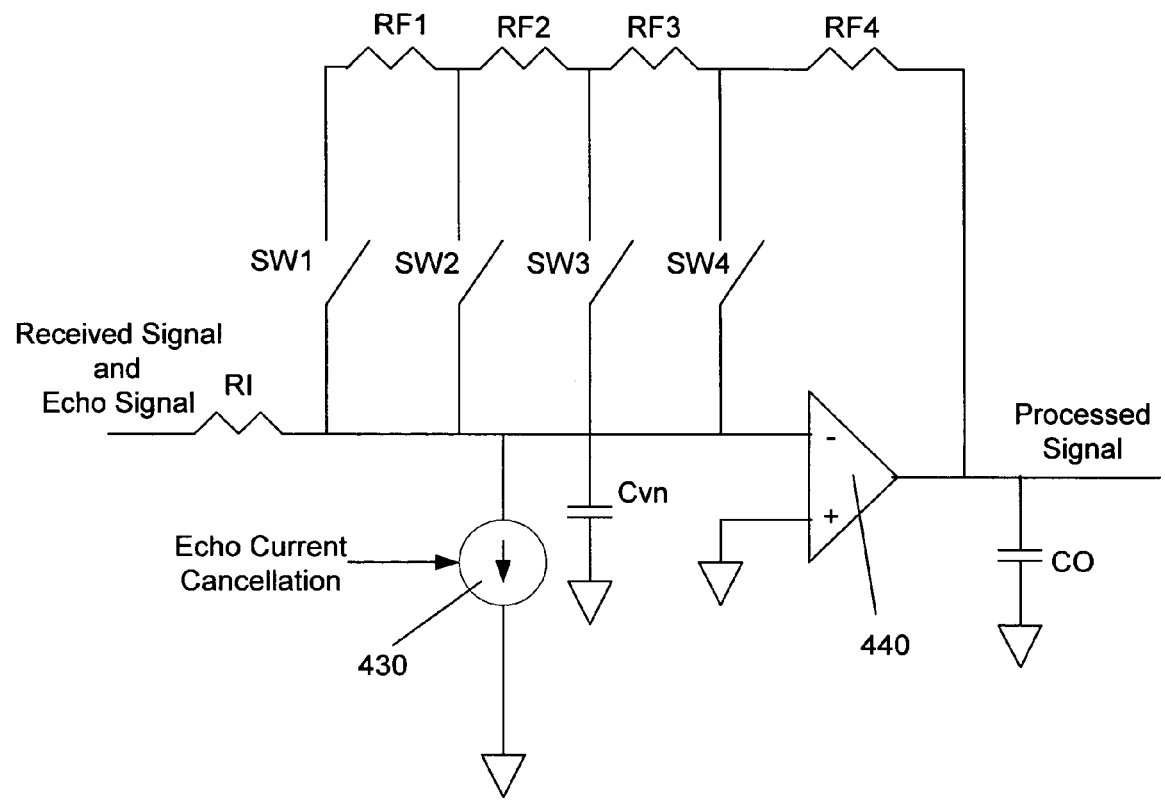
FIG. 4 shows another exemplary preprocessing circuit.

FIG. 4 shows another exemplary preprocessing circuit which only requires a single amplifier 440. As with the previous circuit of FIG. 3, switches SW1, SW2, SW3, SW4 are programmed to set the gain of the preprocessing circuit. Feedback resistors RF1, RF2, RF3, RF4 are switched to control the gain of the preprocessing circuit.

The programmable current source 430 of FIG. 4 sums with the received signal and current source at the virtual ground node of the amplifier 440. Therefore, the echo current cancellation current of the current source 430 cancels the echo signal current before the switches SW1, SW2, SW3, SW4. Therefore, only the cancelled echo signal current and received signal current flows through the switches SW1, SW2, SW3, SW4. The combination of the received signal current and cancelled echo current is substantially less than the original echo signal current, and therefore, improves linearity of the switches SW1, SW2, SW3, SW4.

The embodiments of FIG. 3 and FIG. 4 are shown as single input amplifiers. Preferable embodiments typically include differential input amplifiers. Single input amplifier are depicted in these figures for clarity.

Figure 5:
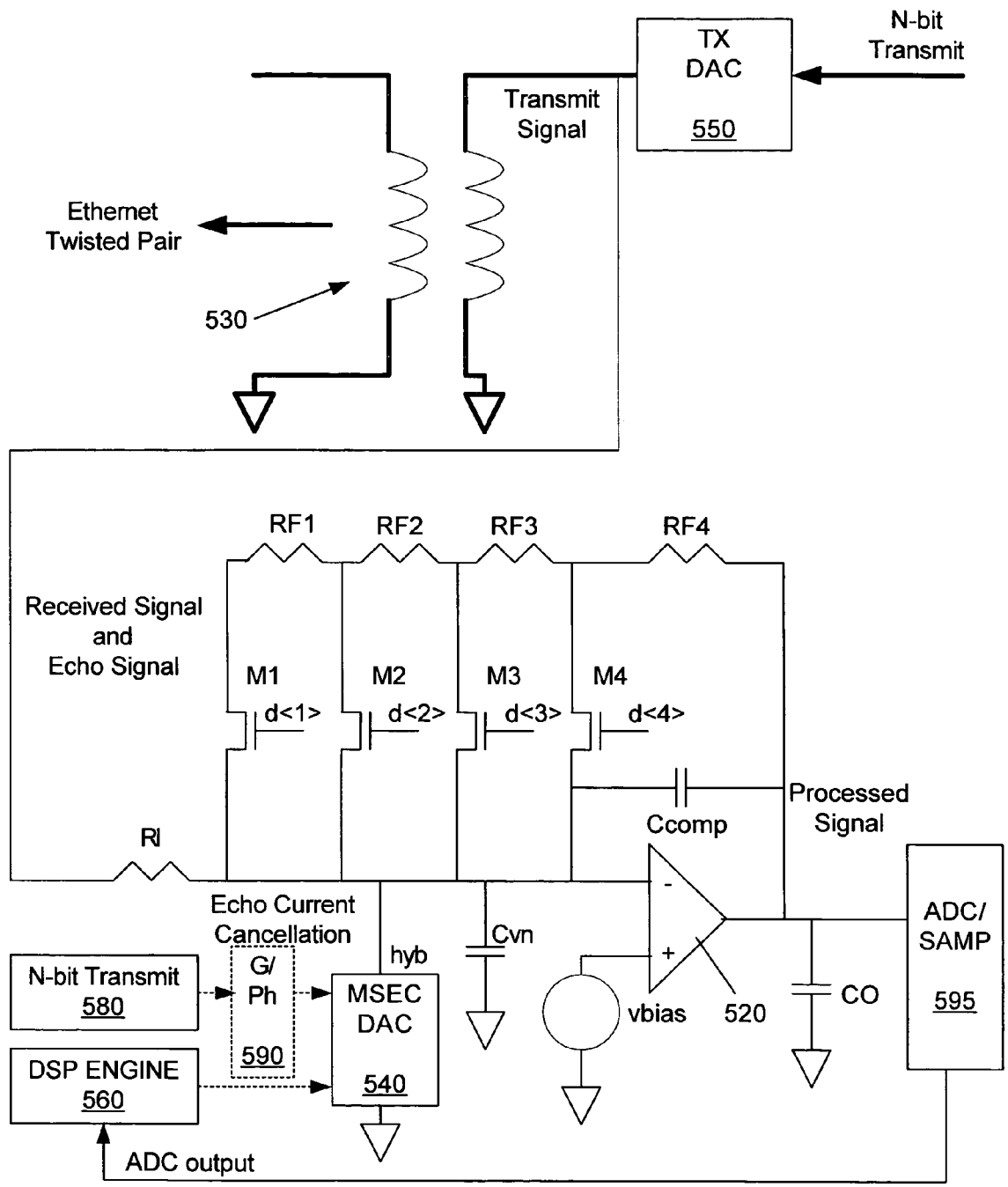
FIG. 5 shows another exemplary preprocessing circuit.

FIG. 5 shows another exemplary preprocessing circuit, showing the preprocessing circuit in greater detail. FIG. 5 shows more clearly why the amplitude of the echo signal can be large relative to the received signal. The transceiver of the preprocessing circuit can simultaneously transmit signals by way of a transmitter DAC 550 through an Ethernet twisted pair, and receive signals through the Ethernet twisted pair. The transceiver is coupled to the Ethernet twisted pair through a transformer 530. Both the transmit section and the receiver section of the transceiver are connected to the transformer 530. One input/output of the transformer 530 is shown as grounded. Typically, the input and output include differential signals, and the two connections to the transformer 530 are both connected to an Ethernet twisted pair, rather than being grounded.

The echo cancellation current is generated by a MSEC (mixed signal echo cancellation) DAC 540. A first embodiment includes the MSEC DAC 540 being controlled by the N-bit transmit input of the transmitter DAC 550, and can additionally include a gain and phase adjustment of the N-bit input. Typically, the N-bit input is a replica (representation) of the N-bit transmit input, rather than the actual N-bit transmit input. That is, typically the N-bit transmit under goes some sort of processing before being received by the MSEC DAC 540, as designated by the gain and phase adjust block 590.

Another embodiment includes the MSEC DAC 540 being controlled by a DSP engine 560. An exemplary DSP engine 560 receives and adaptively filters the N-bit transmit input. The adaptive filtering can include adaptively modifying filter coefficients of an IIR or FIR filter. The coefficients can be modified based upon an echo signal (reflected) received through the transformer 530, and processed, for example, by the previously described pre-processing circuit 210, the sampling circuit 220, and an ADC 595. More specifically, the DSP engine 560 receives the N-bit transmit input and an output signal from the ADC 595. The output signal from the ADC 595 is fed to the DSP engine 560 and adaptively sets or modifies filter coefficients (for example, IIR or FIR) for filtering of the N-bit transmit input, generating a drive signal for the MSEC DAC 540. The net result is that the echo cancellation current of the MSEC DAC 540 cancels both components of the echo signal. More specifically, echo signal due to the direct connection of the transmitter sections to the input of the receiver sections, and echo signal due to reflections of the transmit signal within the transmission channel.

FIG. 5 shows that switch implemented as transistors M1, M2, M3, M4 which are driven by control signals d<1>, d<2>, d<3>, d<4>. The control signals set the gain of the processing circuitry.

The capacitances Cvn and C0 in association with the amplifier and the feedback resistors form a complex low pass transfer function (low pass filter). The roll-off frequency of the low pass filter can be adjusted (vary the capacitance values of Cvn and Co) to provide the appropriate anti-aliasing filtering that is needed for the subsequent sampling. The desired values of Cvn and C0 are typically determined through simulations.

The inclusion of the filtering capacitor Cvn can lead to non-stability of the amplifier 520. A compensation capacitor Ccomp is included to maintain stability of the amplifier with the inclusion of the filtering capacitor Cvn.

Figure 6:
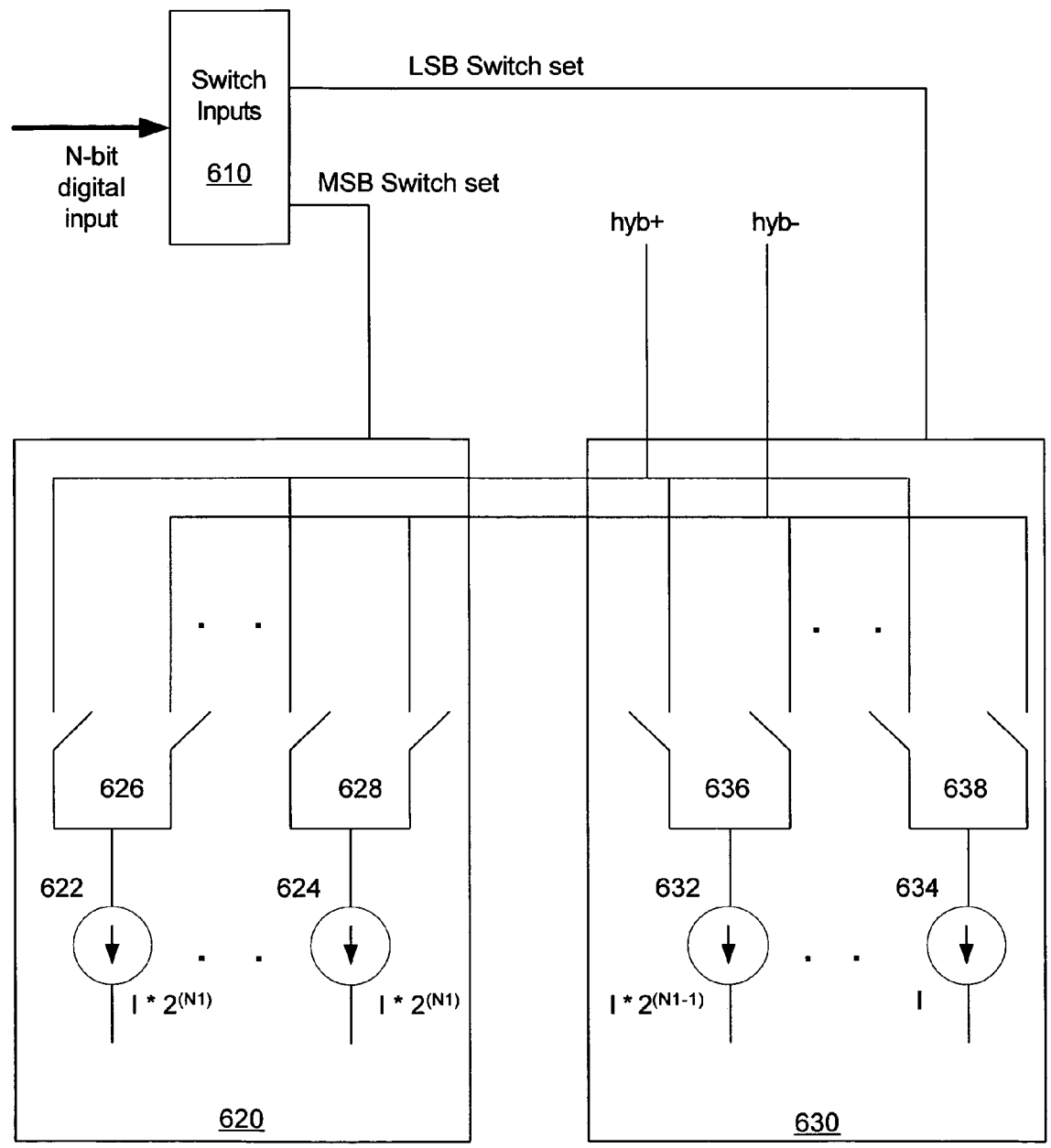
FIG. 6 shows an embodiment of an echo current cancellation current source.

FIG. 6 shows an exemplary embodiment of the MSEC DAC 540. A similar embodiment can be used for the TX DAC 550. The DAC architecture of FIG. 6 is referred to as a segmented current steering (CS) DAC. This architecture includes MSB (most significant bit) current sources that are thermometer decoded, and includes LSB (least significant bit) current sources that are binary decoded. The CS DAC shown includes an M-bit digital input. Segmentation of N1 bits, can include the N1 LSBs implemented as N1 current sources having magnitudes of I, 2I, 4I ... $2^{(N1-1)}$*I. FIG. 6 only shows two LSB current sources 632, 634 in an LSB current source block 630. However, other LSB current sources can be included. For the top M−N1 MSBs, the current sources can be implemented as $2^{(M-N1)}$ thermometer decoded current sources, each current source sourcing a current of magnitude $I*2^{(N1)}$. FIG. 6 only shows two MSB current sources 622, 624 in an MSB current source block 620. However, other current sources can be included.

An exemplary embodiment includes M=12, and N1=6. The corresponding current sources of the LSB current source block 630 for this embodiment would be I, 2I, ... 32I, and the current sources of the MSB current source block 620 would be 63 current sources each sourcing a current having a magnitude of 64I.

Connecting the appropriate current sources to the output of the CS DAC includes latching a digital input which drives corresponding switches. In FIG. 6, the CS DAC includes a switch input block 610 that latches the digital input. The switch input block 610 drives switches 626, 628, 636, 638, thereby setting the magnitude of the current being sourced or sunk by the CS DAC.

The output (current source) is designated by a differential output hyb+ and hyb−. The amplifier of FIG. 5 is shown as a single input amplifier. However, as previously described, the preferable embodiment is probably a differential input amplifier. The differential outputs output hyb+ and hyb− are adaptable for use with a differential amplifier.

Figure 7:
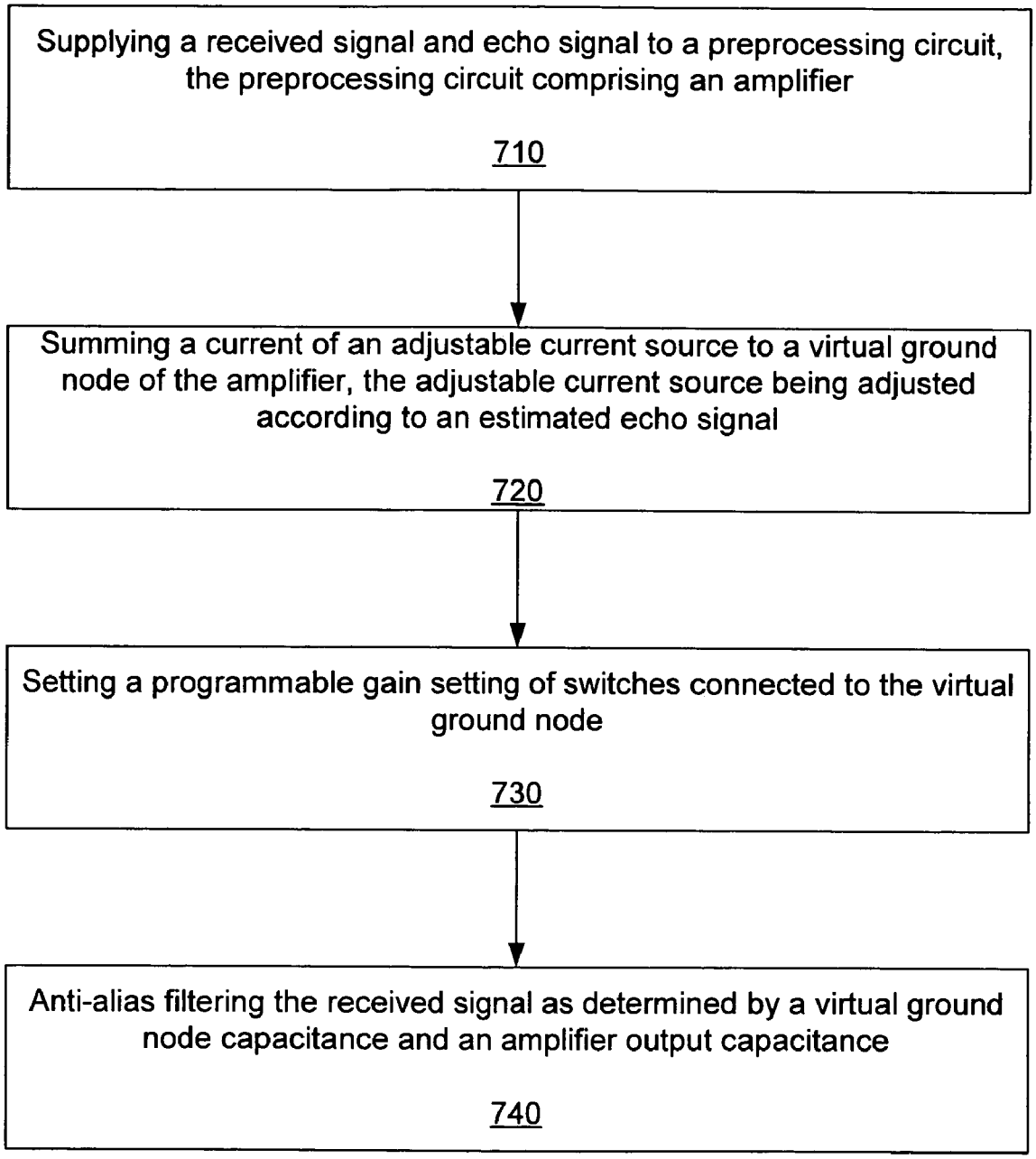
FIG. 7 is a flow chart of an exemplary method of preprocessing.

FIG. 7 is a flow chart showing steps included within a method of processing a transceiver signal before sampling. A first step 710 includes supplying a received signal and echo signal to a preprocessing circuit, the preprocessing circuit comprising an amplifier. A second step 720 includes summing a current of an adjustable current source to a virtual ground node of the amplifier, the adjustable current source being adjusted according to an estimated echo signal. A third step 730 includes setting a programmable gain setting of switches connected to the virtual ground node. A fourth step 740 includes anti-aliasing filtering the received signal as determined by a virtual ground node capacitance and an amplifier output capacitance.

The method of FIG. 7 can be used in conjunction with the embodiments of FIGS. 3, 4 and 5.

A previously described, an embodiment includes an output impedance of the single amplifier being much greater than an output load impedance of the single amplifier. Another embodiment includes an output impedance of the single amplifier being much less than an output load impedance of the single amplifier.

An exemplary embodiment includes each of the plurality of switches being connected to resistive elements, and the programmable gain settings being dependent upon which switches are closed. Non-linearity of the switches can be minimized by only conducting received signal current and cancelled echo signal current through the plurality of switches and amplifier feedback resistance, and conducting the received signal and cancelled echo current through feedback of the amplifier. Linearity of the amplifier can be improved by the adjustable current canceling the echo signal current.

An embodiment of the adjustable current source is an echo cancellation DAC. The echo cancellation DAC can be driven by a replica of a transmit signal, or the echo cancellation DAC can be driven by an adaptive DSP controller which provide for cancellation of reflections of the transmit signal.

Although specific embodiments of the invention have been described and illustrated, the invention is not to be limited to the specific forms or arrangements of parts so described and illustrated. The invention is limited only by the appended claims.

What is claimed:

1. A transceiver pre-sampling device comprising:
a single amplifier having a virtual ground node;
a feed back circuit from an output of the amplifier to the virtual ground node, the feed back circuit comprising;
a plurality of switches connected to the virtual ground node, the switches setting a plurality of programmable gain settings;
an adjustable current source, a current of the adjustable current source being summed at the virtual ground node, the adjustable current source being adjusted according to an estimated echo signal;
a low pass filter tuned to suppress received signal frequencies above a fraction of a sampling frequency of a sampler connected to the pre-sampling device.

2. The transceiver pre-sampling device of claim 1, wherein an output impedance of the single amplifier is much greater than an output load impedance of the single amplifier.

3. The transceiver pre-sampling device of claim 1, wherein an output impedance of the single amplifier is much less than an output load impedance of the single amplifier.

4. The transceiver pre-sampling device of claim 1, wherein each of the plurality of switches are connected to a resistive elements, and the programmable gain settings are dependent upon which switches are closed.

5. The transceiver pre-sampling device of claim 4, wherein each switch corresponds with a resistor of a resistive ladder, and the resistive ladder sets a feedback resistance.

6. The transceiver pre-sampling device of claim 1, wherein pre-sampling device is within a transceiver, and an input signal to the pre-sampling device comprises a received signal and an echo signal of the transceiver.

7. The transceiver pre-sampling device of claim 6, further including only the current of the adjustable current source being conducted through the plurality of switches, and the received signal and cancelled echo current being conducted through feedback of the amplifier.

8. The transceiver pre-sampling device of claim 7, further including the adjustable current canceling current induced by the echo signal, thereby improving linearity of the single amplifier.

9. The transceiver pre-sampling device of claim 6, wherein the echo signal is determined by a transmitted signal, and a replica of the transmitted signal is connected to an echo cancellation DAC, and wherein the echo cancellation DAC generates the adjustable current.

10. The transceiver pre-sampling device of claim 9, wherein the replica of the transmitted signal is gain and phase adjusted before being received by the echo cancellation DAC.

11. The transceiver pre-sampling device of claim 6, wherein the echo signal is adaptively determined by a transmitted signal, and reflections of the transmitted signal, and an echo cancellation DAC generates the adjustable current as controlled by an adaptive DSP controller.

12. A method of processing a transceiver signal before sampling, comprising:
supplying a received signal and echo signal to a preprocessing circuit, the preprocessing circuit comprising an amplifier;
summing a current of an adjustable current source to a virtual ground node of the amplifier, the adjustable current source being adjusted according to an estimated echo signal;
setting a programmable gain setting of a plurality of switches connected to the virtual ground node; and
anti-alias filtering the received signal as determined by a virtual ground node capacitance and an amplifier output capacitance.

13. The method of processing a transceiver signal of claim 12, wherein an output impedance of the single amplifier is much greater than an output load impedance of the single amplifier.

14. The method of processing a transceiver signal of claim 12, wherein an output impedance of the single amplifier is much less than an output load impedance of the single amplifier.

15. The method of processing a transceiver signal of claim 12, wherein each of the plurality of switches are connected to a resistive elements, and the programmable gain settings are dependent upon which switches are closed.

16. The method of processing a transceiver signal of claim 15, further including:
conducting only the current of an adjustable current source through the plurality of switches.

17. The method of processing a transceiver signal of claim 16, further including the adjustable current canceling current induced by the echo signal, thereby improving linearity of the amplifier.

18. The method of processing a transceiver signal of claim 16, further comprising determining the echo signal from a transmitted signal, and connecting a replica of the transmitted signal to an echo cancellation DAC, wherein the echo cancellation DAC generates the adjustable current.

19. The method of processing a transceiver signal of claim 16, further comprising adaptively determining the echo signal from a transmitted signal, and reflections of the transmitted signal, and an echo cancellation DAC generating the adjustable current as controlled by an adaptive DSP controller.

20. An Ethernet receiver comprising:
a pre-sampling device;
a sampler receiving an output of the pre-sampling device;
a bank of ADCs receiving an output of the sampler;
digital processing circuitry generating received signal information based upon an output of the bank of ADCs;
the pre-sampling device comprising;
a single amplifier having a virtual ground node;
a feed back circuit from an output of the amplifier to the virtual ground node, the feed back circuit comprising;
a plurality of switches connected to the virtual ground node, the switches setting a plurality of programmable gain settings;
an adjustable current source, a current of the adjustable current source being summed at the virtual ground node, the adjustable current source being adjusted according to an estimated echo signal;
a low pass filter tuned to suppress received signal frequencies above a fraction of a sampling frequency of a sampler connected to the pre-sampling device.

* * * * *

UNITED STATES PATENT AND TRADEMARK OFFICE
CERTIFICATE OF CORRECTION

PATENT NO. : 7,466,746 B2  Page 1 of 1
APPLICATION NO. : 11/148988
DATED : December 16, 2008
INVENTOR(S) : Sandeep Gupta It is certified that error appears in the above-identified patent and that said Letters Patent is hereby corrected as shown below:

Title Page item 54 & Col. 1 line 1
The correct title is "Single Amplifier Presample Processing Circuitry".

Signed and Sealed this

Tenth Day of March, 2009

JOHN DOLL
*Acting Director of the United States Patent and Trademark Office*